United States Patent [19]
Martin

[11] Patent Number: 5,677,649
[45] Date of Patent: Oct. 14, 1997

[54] FREQUENCY-VARIABLE OSCILLATOR CONTROLLED HIGH EFFICIENCY CHARGE PUMP

[75] Inventor: Chris G. Martin, Boise, Id.

[73] Assignee: Micron Technology, Inc., Boise, Id.

[21] Appl. No.: 291,975

[22] Filed: Aug. 17, 1994

[51] Int. Cl.⁶ .................. H03B 5/02; H03K 3/03; G05F 1/10
[52] U.S. Cl. .............. 331/57; 327/536; 331/75; 331/179; 365/203; 365/189.09
[58] Field of Search .................. 331/57, 179, 75; 365/203, 189.09; 327/536

[56] References Cited

U.S. PATENT DOCUMENTS

| | | | |
|---|---|---|---|
| 4,105,950 | 8/1978 | Dingwall | 331/57 |
| 4,517,532 | 5/1985 | Neidorff | 331/57 |
| 4,631,421 | 12/1986 | Inoue et al. | 327/537 |
| 5,023,465 | 6/1991 | Douglas et al. | 365/203 |
| 5,038,325 | 8/1991 | Douglas et al. | 365/189.06 |
| 5,389,898 | 2/1995 | Taketoshi et al. | 331/57 |
| 5,426,334 | 6/1995 | Skovmand | 327/544 |
| 5,461,591 | 10/1995 | Kim et al. | 327/534 |

*Primary Examiner*—Siegfried H. Grimm
*Attorney, Agent, or Firm*—Fletcher & Associates

[57] ABSTRACT

An integrated circuit semiconductor device includes a charge pump to provide current at a potential which is greater than a supply potential. The charge pump utilizes an oscillator, which causes the charge pump to cycle, and thereby provide a continuous output at an elevated potential. In order to optimize efficiency of the charge pump, the oscillator is able to change its frequency in response to output potential. In the preferred embodiments, this is accomplished by selectively inserting a supplemental portion into a ring oscillator loop. When used with an integrated circuit device, such as a DRAM, the current from the charge pump may be supplied to nodes on isolation devices and nodes on word lines, thereby improving the performance of the DRAM without substantially changing the circuit configuration of the DRAM array.

13 Claims, 5 Drawing Sheets

FREQUENCY-VARIABLE OSCILLATOR CONTROLLED HIGH EFFICIENCY CHARGE PUMP

FIELD OF THE INVENTION

This invention relates to semiconductor integrated circuit devices and more particularly charge pump boost circuits. The invention is particularly applicable to dynamic random access memory devices ("DRAMs") in which the charge pump is used for providing current to voltage-sensing amplifiers ("sense amps") which are part of the integrated circuits.

BACKGROUND OF THE INVENTION

Even though semiconductor integrated circuit devices, including the present invention, are comprised of various materials which are either conductive, insulating or semiconductive electrically, such circuit devices are usually simply referred to as "semiconductor devices." One of the semiconductive materials typically used is silicon, which is utilized in either single-crystal silicon form or in polycrystalline silicon form (i.e., as "polysilicon" or "poly").

In the operation of certain semiconductor devices, it is necessary to "draw up" a node of the sense amps to a potential above $V_{CC}$, the basic operating voltage of the device. In the context of the present invention, these nodes to be drawn up occur on isolation ("iso") devices on an array of a memory device and on word lines for an array. Memory devices with word lines, which use such iso devices on an array, include DRAMs. A conventional arrangement of DRAM memory cells with a sense amp is shown in FIG. 1, which is discussed in greater detail hereinafter. Other types of memory devices, such as static RAMs and video RAMs also may have similar circuit arrangements. An iso device operates to isolate, electrically, circuitry for providing digits during a "digit load" from a sense amp so that during digit load the sense amp can amplify the digit load signal faster without having to first overcome the effects of a directly coupled load. More specifically, where the iso device comprises an n-channel transistor connected in series along a digit line, the iso device can be used to control the RC loading on the sense amp. By turning the iso device to the OFF state, the digit line is separated into two pans, each pan presenting a reduced RC load in comparison with the load of the whole digit line as is presented to the sense amp when the iso device transistor in the ON state.

Generally, with respect to the design of iso devices, it is known that "gating" an iso device with a higher potential, i.e., increasing $V_{GS}$ speeds (i.e., reduces) read time and reduces the required size of the iso device. Typically, in a DRAM, the iso device is used with either multiplexed or non-multiplexed sense amps. In the case of multiplexed sense amps, reducing the size of the iso device (by increasing $V_{GS}$) allows the circuit layout to be configured with the iso-devices "on pitch" (two pitch) rather than in a four pitch pattern. This simplifies layout design because the two pitch layout provides a configuration in which, for each sense amp, both iso devices are individually aligned with that sense amp. With four pitch layout patterns, more than one sense amp must be balanced as a unit. The decrease in device width is obtained because increasing potential to gate gives the device a greater effective electrical transistor width as is necessary to keep discharge time short and response speed high.

In the prior art, bootstrapping had been used in order to charge nodes of a circuit (such as iso nodes) to an increased potential. A bootstrap circuit provides an increased voltage level at a particular time in response to a particular sequence of events, such as the receipt of a series of timing signals. A charge pump circuit, on the other hand, provides a continuous output and an increased potential. The continuous high-potential output of a charge pump circuit essentially means that the charge pump's output is not especially dynamic and that the timing sensitivities of the output do not limit its utility in providing elevated voltage to circuit nodes. This is particularly important when a high-potential node is used (as is frequently the case) for the word line of a DRAM memory device, since the timing for selecting and addressing the word line is critical to the access speed of the DRAM. Because the bootstrap circuit provides the increased voltage in a timed manner, individual bootstrap circuits must be provided for each of several nodes, each of which requires current at elevated potentials at specific different times. The charge pump, with its continuous output, can be used for supplying current to any of these nodes without similar timing restrictions.

Also, unlike bootstrap circuits, charge pumps do not involve problems of proximate spacing. A bootstrap circuit is positioned by the portion of the device which obtains elevated potential from that bootstrap circuit, that individual bootstrap circuit being dedicated to a particular driven circuit. Because bootstrap circuits are dedicated to particular driven circuits and positioned thereby to facilitate the operation of the particular driven circuit, the amount of total effective circuit area of the driven circuits is necessarily increased. This increase could occur even where the driven circuits include relatively small individual transistors. Charge pumps can provide elevated potential to many nodes and need not be positioned proximately.

Prior art charge pumps consist of an oscillator and capacitor. The use of an oscillator and capacitor along with a single clamp circuit provides a relatively constant elevated potential, but is somewhat inefficient when compared to a bootstrap circuit.

With respect to additional design considerations, an ideal auxiliary circuit for performing a function such as voltage elevation should automatically respond to circuit conditions which make the auxiliary circuit unsuitable for its application. For example, a voltage boosting circuit would ideally attenuate its increased potential output or be bypassed as external system voltage becomes sufficiently high to make the use of the boosting circuit undesirable.

U.S. Pat Nos. 5,023,465 and 5,038,325 describe charge pumps in which a minimum potential is maintained by providing a bypass circuit at the charge pumps's outputs, which include an overvoltage shutdown circuit that functions to disable the charge pumps when output potential exceeds a predetermined level. In each case, the auxiliary circuits to the charge pumps do not change the functional performance of charge pump circuitry itself, while that circuitry is in operation.

An additional circuitry feature, which does affect a basic functional performance characteristic of a charge pump, relates to the oscillator frequency. Certain DRAM parts made by the assignee of the present invention, Micron Technology, Inc., for example, have been designed with a metal mask option which permits production changes in the oscillation frequency of the oscillator used to drive the DRAM charge pump. Such a design allows the charge pump to be set with respect to (1) the time required to achieve an elevated voltage, and (2) the elevated voltage attainable, by selecting the charge pump's drive frequency from among available frequencies. This feature only affects the initial selection of the drive frequency on a one-time basis, however, usually prior to fabrication.

Accordingly, the known practices for using a charge pump circuit to provide elevated voltage have benefits over bootstrap circuits, but have disadvantages with respect to efficiency, and responsiveness to contingencies during operation and in multi-product design. The present invention addresses the aforementioned problem confronted using prior art charge pump circuits.

SUMMARY OF THE INVENTION

In accordance with the present invention, an integrated circuit device includes a charge pump to provide current at a potential which is greater than a supply potential. The current is supplied to certain nodes on the integrated circuit device in order to enhance the performance of the integrated circuit device.

When used with an integrated circuit device, such as a DRAM, the current from the charge pump may be supplied to any of several nodes on isolation devices and nodes on word lines. This allows the nodes to be operated at an elevated potential, thereby improving the performance of the DRAM. This enhanced performance is achieved without substantially tailoring the design of the charge pump to match any particular isolation device or word line nodes, and while maintaining sufficient separation between the charge pump circuit and nodes of the DRAM to be driven, and flexibility in the charge pump design so that, in the event that the use of the charge pump proves to be inopportune, the charge pump can be bypassed by minor changes in the masks used to produce the integrated circuit device. This configuration allows the same basic mask layout to be used in different DRAMs designed to operate under different parameters.

Likewise, in accordance with the principles and teaching of this invention, and in keeping with one of its aspects, the charge pump is provided with an overvoltage shutoff circuit. The overvoltage shutoff circuit permits the charge pump to operate under conditions of low supply voltage when an elevated voltage is needed from the charge pump, but allows charge pump to be effectively bypassed when supply voltage is sufficiently high to make bypass desirable.

In accordance with a further aspect of the invention, the charge pump is designed to operate at a higher efficiency by the use of a pair of clamp circuits. An oscillator provides an output to a pair of capacitors. Each capacitor is bypassed respectively by one of the clamp circuits, and the clamp circuits are separately timed. The output of the first capacitor is also connected to an output transistor which is gated by the second clamp circuit connected in parallel to the second capacitor. The controlled gating of the output transistor permits the clamp circuit to maintain a continuous output at an elevated potential, while reducing power loss caused by impedances within the charge pump circuit.

By using the charge pump as a source of elevated potential, the circuit layout of the DRAM array is simplified and the potential boosting circuitry can be located outside of the array, on the periphery of the integrated circuit.

DETAILED DESCRIPTION OF THE PREFERRED EMBODIMENTS

Figure 1:
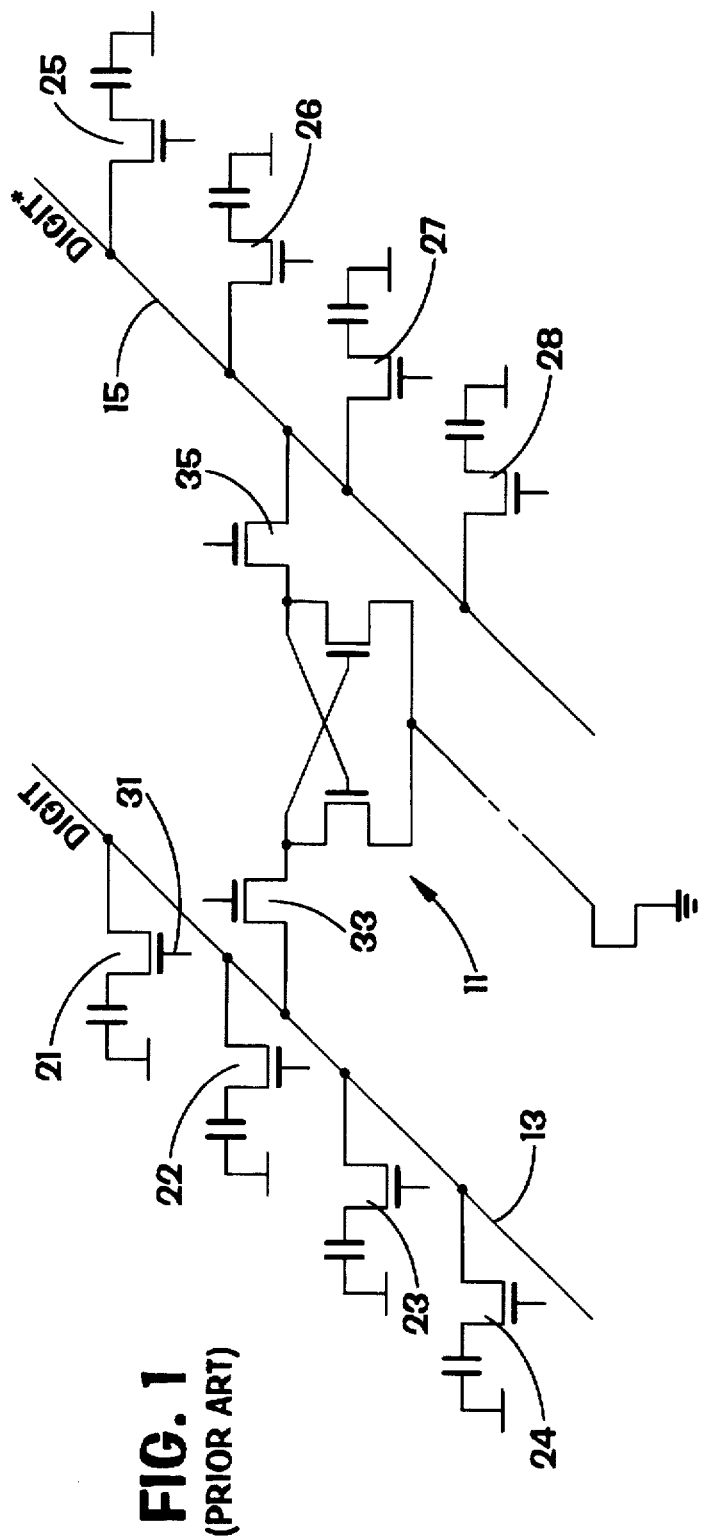
FIG. 1 shows a conventional configuration of sense amps in a DRAM array.

Referring to FIG. 1, a sense amp 11 is connected between Digit and Digit* lines 13 and 15 on a DRAM array. Digit and Digit* lines 13 and 15 are connected to an array of memory cells, such as cells 21–28, which are also shown.

The memory cells 21–28 are connected to Digit and Digit* lines 13 and 15 through word lines, such as word line 31, comprising the gate of the transistor associated with one of memory cells 21–28. Iso devices 33 and 35 are used to gate the current between the sense amp 11 and either of the Digit and Digit* lines 13 and 15 in order to permit the sense amp 11, which is a differential amplifier, to sense the relative levels of the Digit and Digit* lines 13 and 15. By selectively gating one of the memory cells 21–28 to either of Digit and Digit* lines 13 and 15, it is possible to detect the memory storage level in the memory cell. The memory storage level of the selected memory cell on the connected line will be either higher or lower than the potential of the other and unconnected line. The bit represented by the level of the selected cell is a logical high (one) or low (zero), depending on whether it is higher or lower, respectively, than the level of the unconnected line.

In order to increase the sensitivity of the differential amp 11 and to permit the differential amp 11 to more rapidly respond to the differential potential between Digit and Digit* lines 13 and 15, the iso devices 33 and 35 must have a relatively large effective transistor width. One way to accomplish effectively larger transistor width without actually increasing the physical size of iso devices 33 and 35 is to gate the iso devices 33 and 35 at a slightly elevated potential, i.e., to have $V_{GS}$ greater than $V_{CC}$. Having $V_{GS}$ greater than $V_{CC}$ reduces resistance between gate and source, thereby increasing effective transistor width.

That is, preferably, the gating of iso devices 33 and 35 of the higher $V_{GS}$ potential is by means of a signal line to iso devices 33 and 35. The inclusion of the signal line, which is part of an address circuit and makes the iso devices larger, involves further size considerations and requires a specific design trade off; as a rule, smaller iso devices advantageously increase sensing speed but cause a disadvantageous increase in the time required for Digit and Digit* lines to fully discharge to ground. Bigger iso devices discharge more quickly, allowing Digit and Digit* lines to be written to opposite states faster, but yield a decrease in sensing speed. However, the slow discharge problem associated with a smaller iso device of a given desired drive ability can be addressed by elevating $V_{GS}$. Thus, addressing the reduced-resistance and time-to-discharge issues by elevating $V_{GS}$ results in a relatively smaller iso device which is easier to design into high density circuitry.

Figure 2:
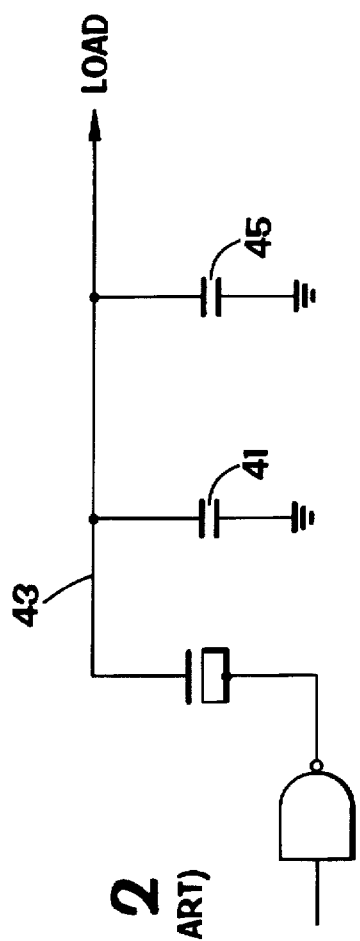
FIG. 2 schematically shows a configuration of a charge pump.

With respect to other features of the context in which the invention is applicable, FIG. 2 shows a schematic diagram of an auxiliary circuit for elevating potential at a circuit node. The node 43 at which the auxiliary circuit is coupled to the node to be elevated has an inherent capacitance, indicated by capacitor 45, resulting primarily from the line capacitance of the load. The amount of inherent capacitance represented by capacitor 45 may be unpredictable until the circuit is constructed, but this capacitance is believed to stabilize the potential from the auxiliary circuit and, in effect, function as an integral part of the auxiliary circuit. The charge pump of the present invention provides a way to vary the frequency and, thus, variation in the inherent and useful capacitance of the charge pump is possible. However, an inherent capacitance exists and will be maintained for any frequency choice.

Figure 3:
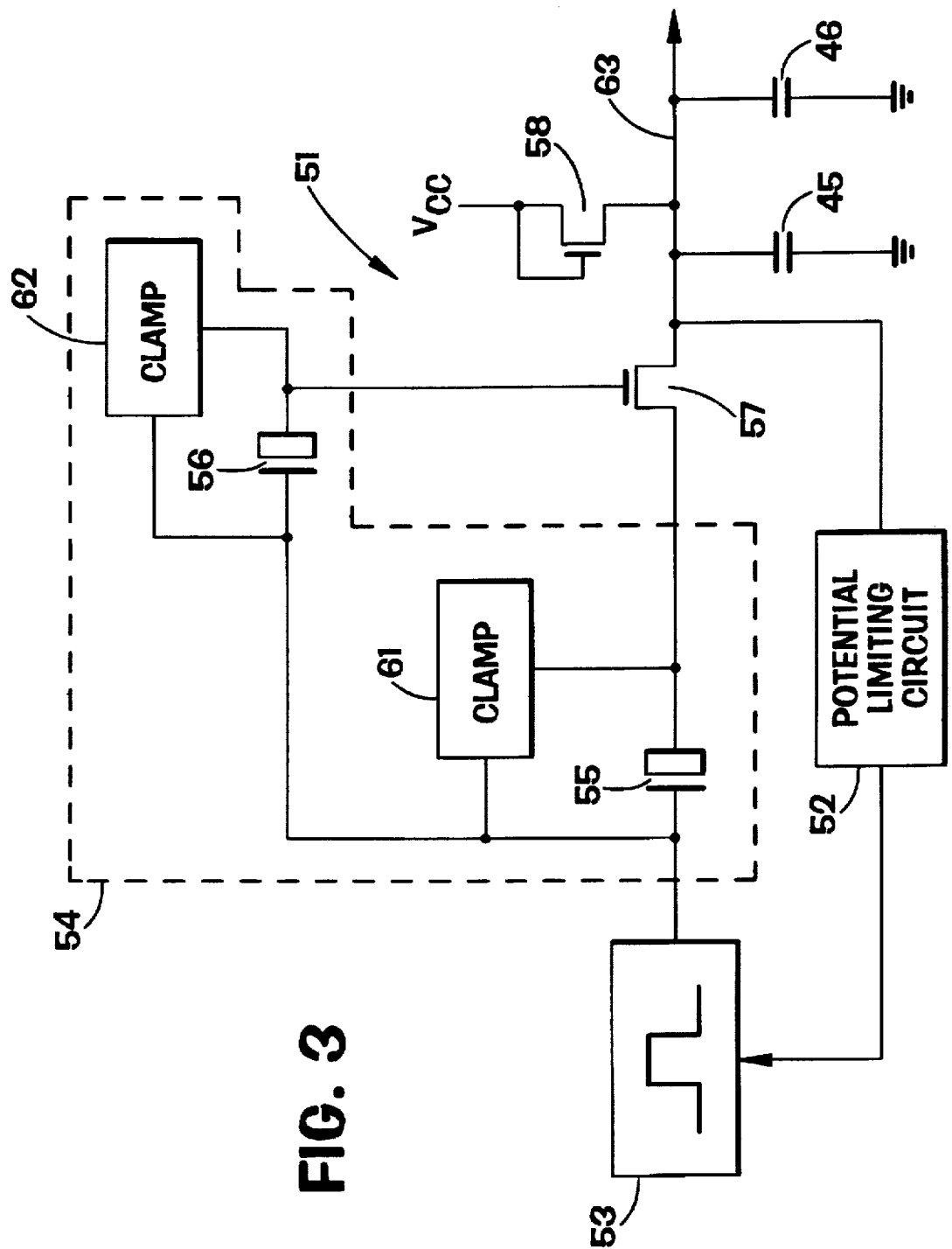
FIG. 3 is a schematic block diagram of a charge pump with overcharge protection, which can be constructed with an oscillator circuit made in accordance with the teachings of the present invention.

FIG. 3 shows a basic circuit for a charge pump into which the present invention can be incorporated. This circuit is described in the assignee's U.S. Pat. Nos. 5,023,465 and 5,038,325. This circuitry is used in a preferred embodiment of the invention which further includes the oscillator described in detail below with reference to FIG. 4.

The charge pump 51 includes an oscillator 53 that is powered by a signal level voltage source $V_{CC}$. The oscillator 53 provides its output to a pulse circuit 54. The pulse circuit 54 responds to the oscillator 53 in a manner which results in the pulse circuit 54 providing a potential output at an output node 63 at a boosted level $V_{CCP}$ as compared to the signal level voltage source $V_{CC}$ in response to an oscillating signal from the oscillator 53. The pulse circuit 54 includes three switching circuits illustrated as a first clamp circuit 61, a second clamp circuit 62, and a transistor 57. The clamp circuits 61, 62 are connected across capacitors 55, 56, respectively.

The charge pump 51 is designed to operate at a higher efficiency by the use of the pair of clamp circuits 61, 62. The oscillator 53 provides an output to the capacitors 55, 56. Each capacitor 55, 56 is bypassed respectively by one of the clamp circuits 61, 62, and the clamp circuits 61, 62 are separately timed. The output of the first capacitor 55 is also connected to the transistor 57, which is gated the second clamp circuit 62. The controlled gating of the transistor 57 permits the charge pump to maintain a continuous output at an elevated potential $V_{CCP}$ with respect to the signal level voltage source $V_{CC}$, while reducing power loss caused by impedances within the charge pump circuit 51.

A decoupling capacitor 46 is coupled to the output node 63 to help maintain a steady boosted output. A potential limiting circuit 52 is coupled between the output node 63 and the oscillator 53 to prevent the potential at the output node 63 from exceeding a predetermined value. If the potential provided by the charge pump 51 at the output node 63 is inadequate, a diode-connected transistor 58 is used to bypass the charge pump 51.

In order to reduce operating current in the semiconductor device, it is desired to determine the minimum power and corresponding frequency required to provide a sufficient boosted potential output from the charge pump to the device. The minimum frequency is a function of the physical parameters of the component circuit elements, and may be variably and dynamically set by adjusting the frequency of oscillator 53. By so doing, it is possible to construct a charge pump which, if operated at a first frequency, provides a reduced output, and if operated at a second higher frequency, provides an increased output. The present invention provides a means to control the output of the charge pump in the aforementioned manner.

With respect to power requirements for a DRAM, it is known that different read and write cycles cause an increase or decrease in power demand, and that the need for an increased charge pump output also can be caused by changes in supply potential $V_{CC}$. However, it is not necessary in making the charge pump responsive to determine dynamically the state of all power demand variables. It is sufficient for a dynamically responsive charge pump to determine a fixed number, for example, two load states to which the charge pump output ($V_{CC\ reg}$) can be made to correspond. It is necessary to determine the maximum load at which a boosted output of the charge pump ($V_{CC\ reg}$) must be provided; and it is advantageous to determine a steady state or quiescent operating mode, during which $V_{CC\ reg}$) is provided to a reduced load. With the present invention, the output of charge pump 51 is adjusted to correspond to load states by adjusting the oscillator frequency of oscillator 53 used to drive the pulse circuit 54. This is preferably accomplished by selectively bypassing a portion of the ring oscillator circuitry of oscillator 53 in accordance with the output potential or output load of the charge pump 51.

Figure 4:
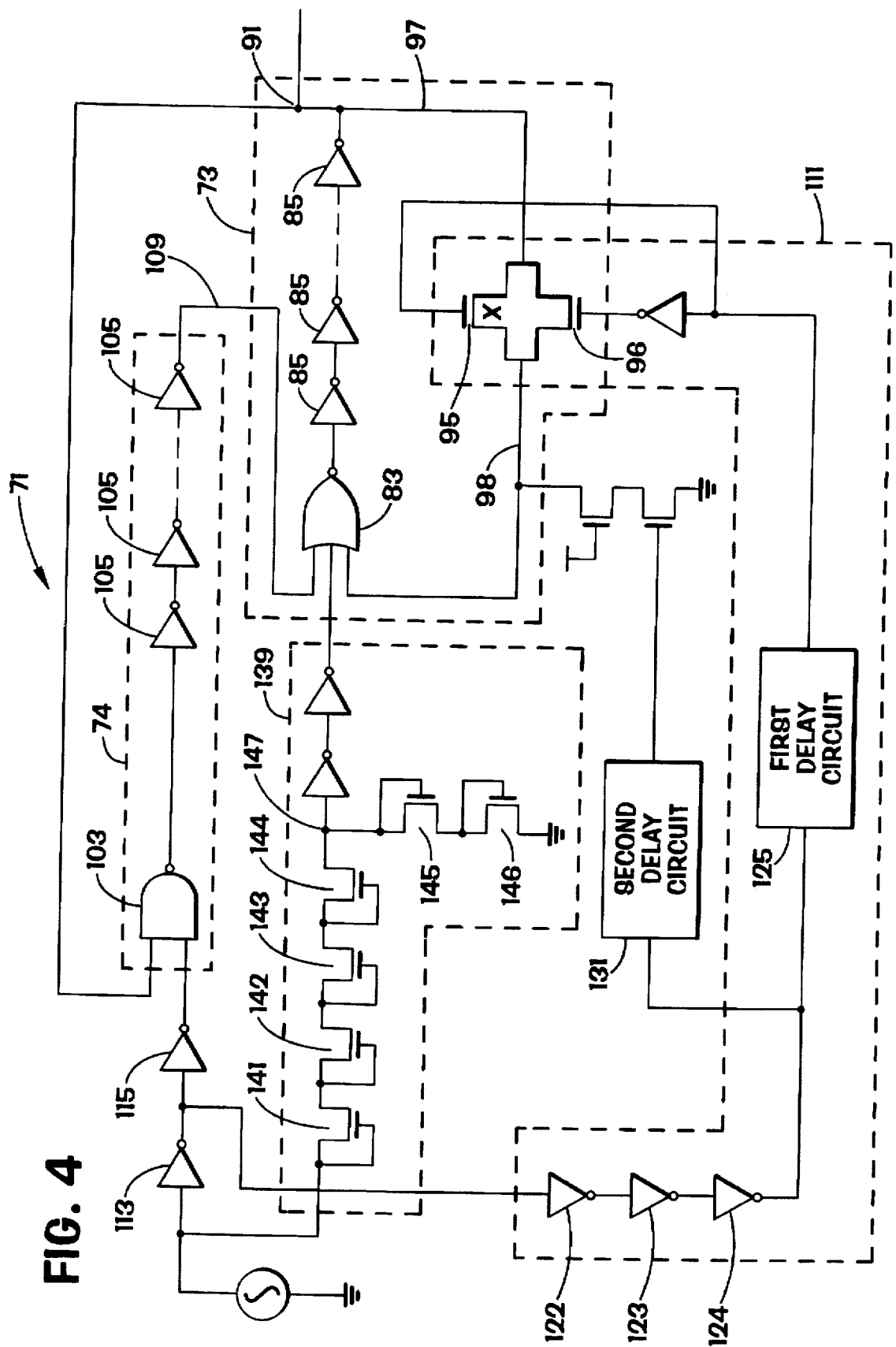
FIG. 4 is a detailed schematic diagram showing the oscillator circuit for a charge pump according to the present invention.

FIG. 4 shows a configuration of the oscillator 53 in which a ring oscillator 71 includes a primary loop 73 and a secondary loop portion 74. As will be seen, the primary loop 73 functions alone during a fast mode of operation, and it functions in combination with the secondary loop portion 74, to form a larger loop, during a slow mode of operation.

Primary loop 73 consists of a NOR gate 83 and a first plurality of invertors 85. The circuit is effectively a delay line which transmits pulses to an output node 91. Pulse signals at the output node 91 are either transmitted through the secondary loop portion 74 and back to primary loop 73 through NOR gate 83 or through transistors 95 and 96 back to only primary loop 73 through NOR gate 83. In either case, the receipt of the pulse signal at NOR gate 83 results in the signal being transmitted through the first plurality of invertors 85, and therefore results in a repetitively pulsed output at the output node 91. The number of invertors comprising plurality 85 should be EVEN; the plurality may comprise, for example, 20 invertors. This pulsed output is used as an oscillator or pulse signal to drive the pulse circuit 54 of the charge pump 51 (see FIG. 2).

Transistors 95 and 96 form a pan of a bypass circuit, which includes lines 97 and 98, for allowing transmission of pulses from the output node 91 to NOR gate 83, bypassing secondary loop portion 74.

Secondary loop portion 74 consists of a NAND gate 103 and a second plurality of invertors 105. Pulse signals at the output node are provided to the NAND gate 103, which in turn provides signals to the second plurality of invertors 105. The number of invertors comprising plurality 105 should be ODD; the plurality may comprise, for example, 17 invertors. The second plurality of invertors 105 provide an input, at node 109, to NOR gate 83. The secondary loop portion effectively delays the pulses at the output node 91 from being transmitted to NOR gate 83, thereby slowing the pulse repetition rate, and therefore, reducing the oscillation frequency at the output node 91.

When secondary loop portion 74 is not bypassed and operates to reduce the oscillation frequency at the output node 91, the bypass circuit through transistors 95 and 96 is shut off. This prevents signals being transmitted directly back to NOR gate 83 through transistors 95 and 96 at that time. That avoids the faster pulse repetition rate obtained by transmitting pulses through transistors 95 and 96.

For purposes of explanation, NAND gate 103 corresponds to the oscillation control according to the invention. However, the invention can be practiced without NAND gate 103 by using other components. Indeed, any other components which may be used suitably to provide the function of NAND gate 103 in controlling secondary loop portion 74 according to the principles of the present invention are acceptable for use as the oscillation control apparatus.

Transistors 95 and 96 form a pan of a bypass control circuit 111. The bypass circuit (which includes transistors 95 and 96, and lines 97 and 98 and also a series connection of invertors and a delay circuit, which are described below) is activated in response to a sensed potential which corresponds to a predetermined output potential of the charge pump 51. That is, when the potential at the output node 91 is of a certain level relative to the desired output $V_{CCP}$ as described below, the activation of the bypass circuit will take place. As described above in connection with one embodiment, the activation of the bypass circuit increases the oscillation frequency of the ring oscillator 71 by removing secondary loop portion 74 from the operative oscillator loop.

When the output potential $V_{CCP}$ of the charge pump 51 falls below a predetermined level, that indicates that the charge pump 51 must increase its output, and therefore, the ring oscillator 71 must provide an increased oscillation frequency. The increased oscillation frequency will increase the output of the charge pump 51, and consequentially increase $V_{CCP}$.

Figure 5:
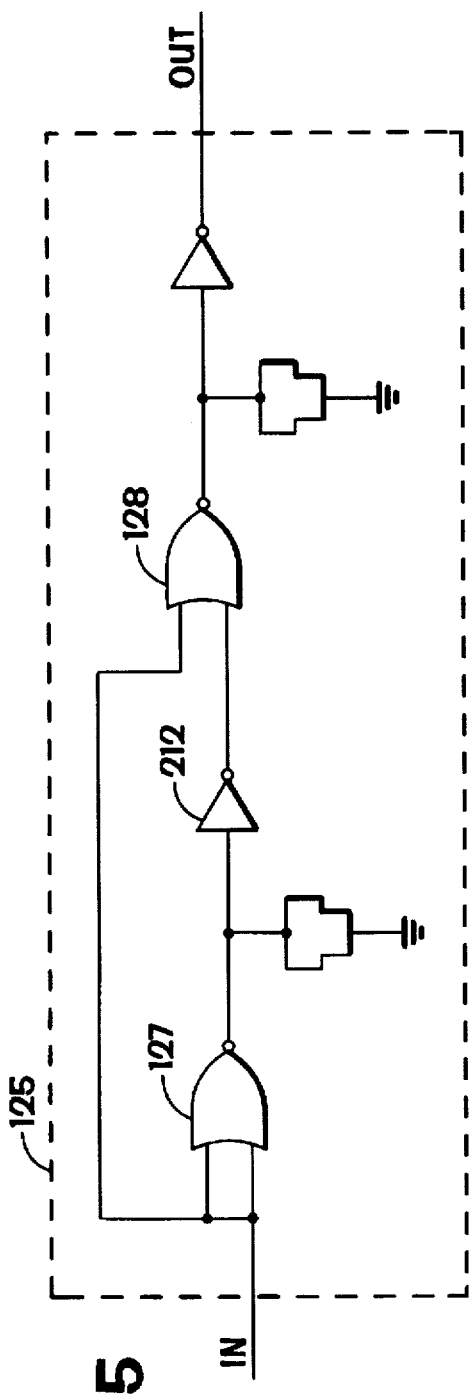
FIGS. 5 and 6 are schematic diagrams showing the first and second delay circuits of FIG. 4 in greater detail.

While the bypass circuit through transistors 95 and 96 is activated, NAND gate 103 transmits a continuous signal (at a 0 logic level), and therefore the secondary loop portion 74 is made quiescent. An input invertor 113 and a secondary trigger invertor 115 provide a signal to NAND gate 103, which allows NAND gate 103 to respond to signals from the output node 91. Input invertor 113 responds if charge pump output signal $V_{CCP}$ supplied to the invertor 113 is at a predetermined level which is sufficient to trigger the invertor 113. If the potential to $V_{CCP}$ to input invertor 113 is below the predetermined level (of $V_{CCP}$), then NAND gate 103 receives a logical 0 and the secondary loop portion 74 is forced quiescent (the continuous 0 logic level). This is the desired result, since in the preferred embodiment, the primary loop 73 does not receive signals from the secondary loop portion 74 when providing the increased oscillation frequency. Bypass control circuit 111 receives the inverted signal and is responsive to the input invertor 113. The bypass control circuit 111 receive the inverted signal from input invertor 113, which is again inverted through invertors 122, 123 and 124. This signal is provided to a First Delay Circuit 125, which causes transistors 95 and 96 to conduct when the potential to input invertor 113 is below the predetermined level of $V_{CCP}$. As shown in FIG. 5, First Delay Circuit 125 includes NOR gates 127 and 128 and other components, which achieve the above-described control of transistors 95 and 96. First Delay Circuit 125 is configured so that the state of the input to NOR gate 127 will affect the delay of the output from the invertor connected to the output of NOR gate 128, as herein described. When the input to NOR gate 127 goes from HIGH to LOW, the invertor output will go from HIGH to LOW relatively slowly, following a path through all the components of circuit 125. When the input to NOR gate 127 goes from LOW to HIGH, the invertor output transitions from LOW to HIGH with less delay, following a path which bypasses NOR gate 127 and the invertor in series with it and going to NOR gate 128 directly and then to the invertor.

Figure 6:
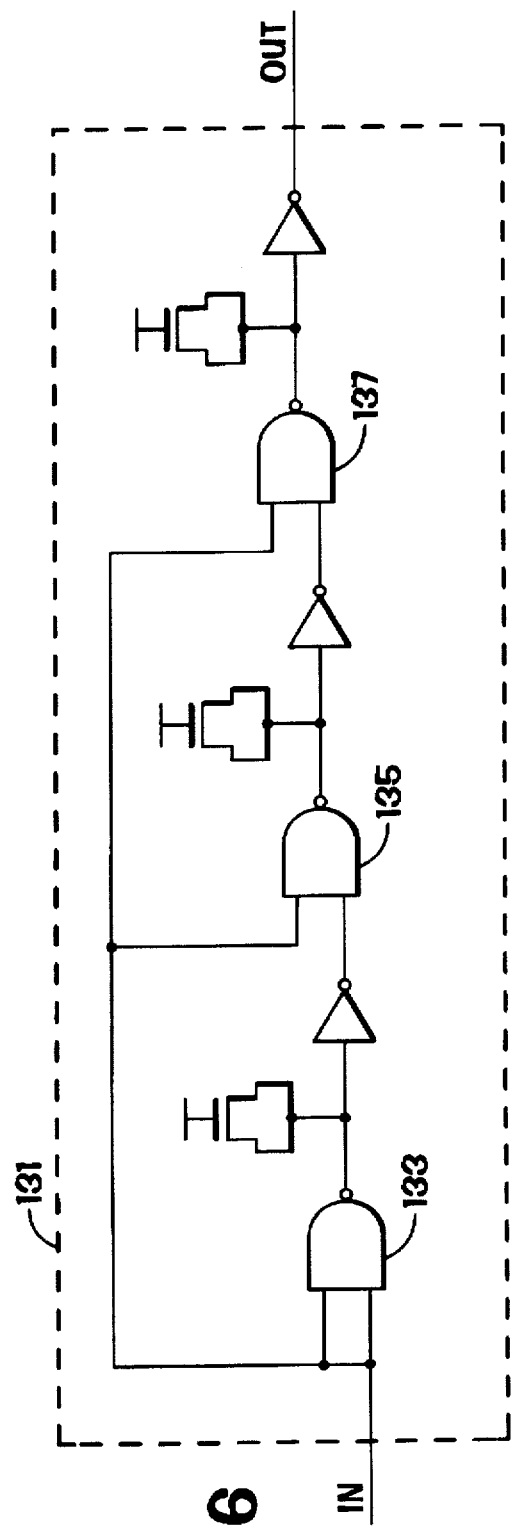

The bypass control circuit 111 causes transistors 95 and 96 to open the bypass circuit when the secondary loop portion 74 is functioning. The bypass control circuit 111 prevents signals being transmitted directly back to NOR gate 83 through transistors 95, 96 at that time. That avoids the faster pulse repetition rate obtained by transmitting pulses through those transistors 95 and 96. A Second Delay Circuit 131 responds to the signal from invertor 124 to ground the outputs of transistors 95 and 96, thereby permitting NOR gate 83 to respond to signals at the output of secondary loop portion 74. This operation of the Second Delay Circuit 131 occurs when bypass control circuit 111 is holding transistors 95 and 96 open. FIG. 6 shows Second Delay Circuit 131 in greater detail. Second Delay Circuit 131 includes NAND gates 133, 135, and 137 and is configured so that the state of the input to NAND gate 133 will affect the delay of the output from the invertor connected to the output of NAND gate 137, as herein described. When the input to NAND gate 133 goes from LOW to HIGH, the invertor output will be delayed through all the devices of the delay circuit. When the input to NAND gate 133 goes from HIGH to LOW, the invertor output will be delayed only briefly, the signal following a path which bypasses NAND gates 133 and 135 and going to NAND gate 137 directly and then to the invertor. The delay realized with the above described delay circuits keep node 98 in a predictable state during transitions between frequencies.

An overvoltage circuit 139 uses diodes 141, 142, 143 and 144 to sense a rise in $V_{CCP}$ above a predetermined limit. In that event, a continuous signal is provided to NOR gate 83, causing the primary loop 73 to go quiescent until $V_{CCP}$ drops below the predetermined limit. In the absence of a voltage sufficient to bias diodes 141–144 (i.e., zero volts or anything below the predetermined amount corresponding to the combined bias voltage), diodes 145 and 146 will pull node 147 to ground keeping the oscillator ON. At or above the predetermined voltage, node 147 will rise causing the oscillator to go OFF.

It is anticipated that current from another bypass circuit (not shown) would maintain potential at the output of the charge pump 51 in order to prevent $V_{CCP}$ from dropping to ground. One method of maintaining potential is a diode-connected transistor. The diode connected transistor is an n channel device connected to a supply voltage node $V_{CCP}$. The transistor will conduct power as long as $V_{CCP} <$ ($V_{CC}-V_T$). It is off whenever $V_{CCP} > (V_{CC}-V_T)$. This portion of the circuit also helps charge up $V_{CCP}$ on power up.

Oscillator Frequency Output Illustrated

Figure 7:
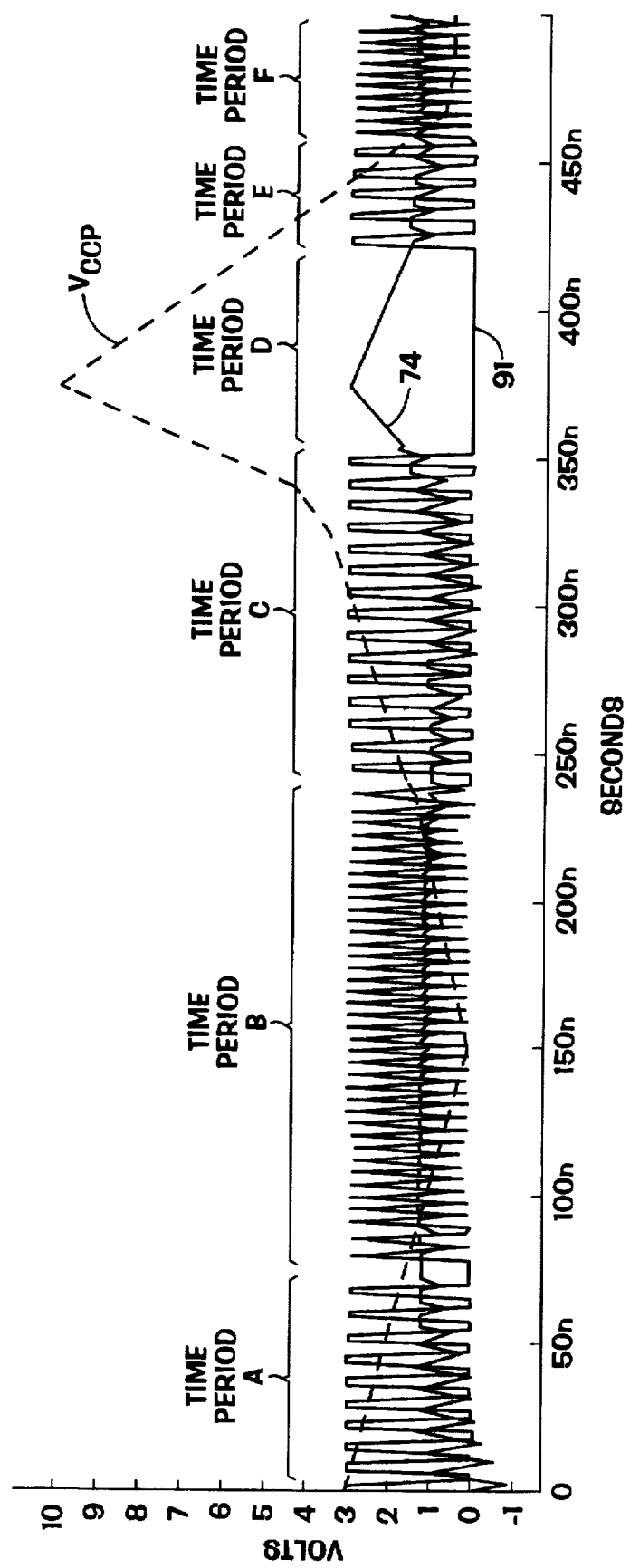
FIG. 7 is a timing diagram showing the relationship of node potential and oscillator frequency for the operation of a charge pump constructed in accordance with the principles of the present invention.

FIG. 7 shows a timing diagram of potential levels generated by the inventive oscillator circuit 71. This diagram represents a computer-generated depiction of the operation of an actual fabricated circuit. The line designated $V_{CCP}$ shows the potential at the input to invertor 113, which is used to drive the oscillator 71. In actuality, the input potential $V_{CCP}$ is in pan controlled by the oscillator 71. Line 91 is the potential at the output node 91.

The left-most side of the diagram shown in FIG. 7 shows the operation of both the primary loop 73 and the secondary loop portion 74. $V_{CCP}$ is at a range at which the ring oscillator 71 is required to operate at a moderate boost mode of operation using primary loop 73 and secondary loop portion 74. This is shown at time period A.

Time period B shows the operation of the circuit when $V_{CCP}$ drops below a predetermined potential. This causes the oscillator 71 to operate in a supplemental boost mode of operation to increase the output of charge pump 51. The secondary loop portion 74 goes quiescent and primary loop 73 oscillates more rapidly as a result of feedback conduction through transistors 95 and 96. The rapid oscillation of the primary loop 73 continues until $V_{CCP}$ increases to above the predetermined potential. The predetermined potential is the potential supplied to the invertor 113 which is sufficient to trigger the invertor 113.

Time period C shows the operation of the ring oscillator 71 when $V_{CCP}$ has again reached the predetermined potential. As in the case of time period A, both primary loop 73 and secondary loop portion 74 are operating, and transistors 95 and 96 open the bypass circuit.

Time period D shows the operation of the overvoltage circuit 139, wherein a continuous signal is provided to NOR gate 83, causing the primary loop 73 to go quiescent until $V_{CCP}$ drops below the predetermined limit. Secondary loop portion 74 is also bypassed. While $V_{CCP}$ is shown rising to substantial levels, it is anticipated that this would not occur during normal operation.

Finally, time period E shows the moderate boost mode of operation, followed by the supplemental boost mode of operation during period F when the potential $V_{CCP}$ drops. While the potential $V_{CCP}$ is shown dropping to 0, it is anticipated that this would normally occur only when a memory part is shut down.

While the invention was developed for use with DRAM memories, it is anticipated that the invention would be useful in other circuits in which a boosted power supply is needed. It is also anticipated that the circuit may be adapted for use with other circuits in which a variable frequency is required.

I claim:

1. In a semiconductor circuit device having at least one signal line which is prechargeable to at least one operating level, a signal level voltage source for providing current at a signal level potential, a circuit connected to the signal line for accepting an elevated potential above a potential of the signal level voltage source, and a precharge circuit for precharging the signal line, the precharge circuit comprising:
    a) an oscillator for receiving current from the signal level voltage source and providing an oscillating output having an oscillation frequency;
    b) a capacitor connected between the oscillator and an intermediate output node;
    c) at least one switching circuit connected in parallel with the capacitor between the oscillator and the intermediate output node for providing a charge pump output in response to the oscillating output, the charge pump output being provided at said elevated potential, the oscillator being responsive to an operating condition of the semiconductor circuit device to change the oscillation frequency of the oscillator, thereby effecting a change in the charge pump output of the switching circuit.

2. The device of claim 1, wherein the oscillator comprises:
    a) a primary loop having a first plurality of inverters;
    b) a secondary loop portion having an additional second plurality of inverters; and
    c) a circuit, coupled to said primary loop and said secondary loop portion and responsive to the charge pump output, for selectively causing only said primary loop to respond to feedback signals from the primary loop when the charge pump output is below a predetermined level, and for selectively causing both said primary loop and secondary loop portion to respond to feedback signals from the primary loop when the charge pump output is above the predetermined level, thereby changing the oscillation frequency output by the oscillator in response to the charge pump output.

3. The device of claim 2, wherein:
    said oscillator operates at a first higher frequency when said primary loop is responsive to feedback signals from said primary loop only and otherwise operates at a second lower frequency when operating, and wherein
    said circuit further includes a bypass circuit for permitting signals corresponding to output signals from the primary loop only to be fed back to the primary loop when the charge pump output is below the predetermined level and for opening said bypass circuit to provide signals from said secondary loop portion to the primary loop when the charge pump output is above the predetermined level.

4. The semiconductor device as described in claim 1, further comprising:
    a) a second switching circuit including an output transistor having a source and drain connected in series with the capacitor between the intermediate output node and an output node; and
    b) a third switching circuit for controlling the second switching circuit by gating the output transistor.

5. The semiconductor device as described in claim 4, further comprising: a second capacitor connected in parallel with the third switching circuit.

6. The semiconductor device as described in claim 5, further comprising:
    a potential maintenance transistor connected to conduct from the signal level voltage source at times when potential at the output node falls below a predetermined potential with respect to the potential of the output node, and to present an open circuit when potential at the output node is greater than the potential of the signal level voltage source.

7. The semiconductor device as described in claim 5, further comprising:
    a potential maintenance transistor having a source and drain connected in series between the signal level voltage source and the output node, the potential maintenance transistor being connected with its gate to the signal level voltage source.

8. The semiconductor device as described in claim 4, further comprising:
    a) means to maintain the output node at a predetermined minimum potential by conducting current from the signal level voltage source; and
    b) a potential limiting circuit responsive to potential at the output node, for attenuating the output of the precharge circuit to limit the potential at the output node.

9. The semiconductor device as described in claim 4, further comprising:
    a decoupling capacitor connected to the output node for providing a storage capacity sufficient to maintain said elevated potential at a potential above the signal level potential during a substantial portion of an operating cycle of the semiconductor circuit device.

10. In a semiconductor circuit device having at least one signal line which is prechargeable to at least one operating level, a signal level voltage source for providing current at a signal level potential, a circuit connected to the signal line for accepting an elevated potential above a potential of the signal level voltage source, and a precharge circuit for precharging the signal line, the precharge circuit comprising:
    a) an oscillator for receiving current from the signal level voltage source and providing an oscillating output having an oscillation frequency;

b) a first capacitor connected between the oscillator and an intermediate output node;

c) a first switching circuit connected in parallel with the capacitor between the oscillator and the intermediate output node for providing a charge pump output in response to the oscillating output, the charge pump output being provided at said elevated potential, the oscillator being responsive to an operating condition of the semiconductor circuit device to change said oscillation frequency of the oscillator, thereby, effecting a change in the charge pump output of the switching circuit;

d) a second switching circuit including an output transistor having a source and drain connected in series between the intermediate output node and an output node;

e) a third switching circuit for controlling the second switching circuit by gating the output transistor;

f) a second capacitor connected in parallel with the third switching circuit;

g) means to maintain the output node at a predetermined minimum potential by conducting current from the signal level voltage source; and h) a potential limiting circuit responsive to potential at the output node for attenuating the output of the precharge circuit to limit the potential at the output node.

11. In a semiconductor circuit device having at least one signal line prechargeable to operating levels, a signal level voltage source providing current at a signal level potential, a circuit connected to the signal line which accepts an elevated potential above a potential of the signal level voltage source, and a precharge circuit which precharges the signal line, the precharge circuit comprising:

a) an oscillator for receiving current from the signal level voltage source and for providing an oscillating output having an oscillation frequency, the oscillation frequency being variable in response to the voltage level of an input signal to the precharge circuit;

b) a capacitor connected between the oscillator and a first node;

c) an output switching circuit connected in series with said capacitor, between said capacitor and an output node; and d) a first clamp circuit connected in parallel with said capacitor and providing a timed output in response to the oscillating output.

12. The semiconductor device as described in claim 11, wherein:

the output switching circuit includes an output transistor having a source and drain connected in series between the first node and the output node and wherein the device further comprises a second clamp circuit for controlling the output switching circuit in a timed sequence with respect to said timed output, the second clamp circuit controlling the output switching circuit by gating the output transistor.

13. The semiconductor device as described in claim 12, further comprising:

a second capacitor connected in parallel with the second clamp circuit.

* * * * *